(12) United States Patent
Kanetsuki et al.

(10) Patent No.: US 6,527,908 B2
(45) Date of Patent: Mar. 4, 2003

(54) PLASMA PROCESS APPARATUS

(75) Inventors: Norio Kanetsuki, Tenri (JP); Takamitsu Tadera, Tenri (JP); Tatsushi Yamamoto, Nara (JP); Masaki Hirayama, Sendai (JP); Tadahiro Ohmi, 2-1-17-301, Komegafukuro, Aoba-ku, Sendai-shi, Miyagi (JP)

(73) Assignees: Sharp Kabushiki Kaisha, Osaka (JP); Tadahiro Ohmi, Miyagi (JP)

( * ) Notice: Subject to any disclaimer, the term of this patent is extended or adjusted under 35 U.S.C. 154(b) by 0 days.

(21) Appl. No.: 09/813,147

(22) Filed: Mar. 21, 2001

(65) Prior Publication Data

US 2002/0043341 A1 Apr. 18, 2002

(30) Foreign Application Priority Data

Mar. 21, 2000 (JP) ........................................ 2000-077538

(51) Int. Cl.$^7$ ............................. H05H 1/00; C23C 16/00
(52) U.S. Cl. ............................. 156/345.41; 156/345.34; 118/723 MW; 118/723 E
(58) Field of Search ....................... 156/345.41, 345.42, 156/345.43; 118/723 MW, 723 E, 723 ME, 723 MR; 315/111.21, 111.31, 111.41, 111.51, 111.61, 111.71

(56) References Cited

U.S. PATENT DOCUMENTS 5,520,771 A * 5/1996 Kanai et al. ............ 156/345.41
5,647,944 A * 7/1997 Tsubaki et al. ......... 156/345.41
6,358,361 B1 * 3/2002 Matsumoto ............ 156/345.41

* cited by examiner

Primary Examiner—Gregory Mills
Assistant Examiner—P. Hassanzadeh
(74) Attorney, Agent, or Firm—Birch, Stewart, Kolasch & Birch, LLP

(57) ABSTRACT

A plasma process apparatus capable of preventing generation of plasma in an unwanted location and performing uniform plasma processing with stability is obtained. The plasma process apparatus includes a processing chamber having an internal wall surface; a microwave radiating member having one wall surface and the other wall surface that faces the internal wall surface of the processing chamber, and being disposed such that a space is formed between the other wall surface and a portion of the internal wall surface, and propagating and radiating microwaves within the processing chamber; and a reactive gas supply member, including a reactive gas supply passage having a space formed between the other wall surface of the microwave radiating member and the internal wall surface; and a microwave transmission preventing member disposed on a region, which faces the reactive gas supply passage, of the other wall surface of the microwave radiating member.

7 Claims, 9 Drawing Sheets

PLASMA PROCESS APPARATUS

BACKGROUND OF THE INVENTION

1. Field of the Invention

The present invention relates to a plasma process apparatus, and more specifically, to a plasma process apparatus capable of suppressing generation of plasma in an unwanted location and performing a stable and uniform plasma processing.

2. Description of the Background Art

Conventionally, in the manufacturing steps of a liquid crystal device, a semiconductor device, and the like, a plasma process apparatus is employed which utilizes plasma in such steps as a deposition step, an etching step, and an ashing step. With such a plasma process apparatus, a uniform plasma needs to be generated for an entire surface to be processed, in order to perform uniform processing, such as deposition, for the entire surface to be processed of a substrate that is the target of the processing.

Moreover, in recent years, larger-scale substrates are being formed in the field of semiconductor devices, represented by semiconductor memory devices and such, and in the field of liquid crystal devices, and so on. In particular, in the case of a TFT (Thin Film Transistor) liquid crystal display device, a substrate that is as large as 500 mm×500 mm to 1 m×1 m as well as a substrate of an even larger size may possibly be used. Thus, there is a need for a plasma process apparatus that is capable of improving processing uniformity within a surface to be processed by generating uniform plasma for the entire surface to be processed of such a large substrate.

In order to realize such uniform plasma processing for a large substrate described above, a plasma process apparatus as the one shown in FIG. 9 is proposed. FIG. 9 is a schematic cross sectional view representing a plasma process apparatus that forms the basis for the present invention. The plasma process apparatus will be described with reference to FIG. 9.

As shown in FIG. 9, the plasma process apparatus is provided with a chamber lid 101, a chamber body 102, microwave introduction windows 104a, 104b, a shower plate 105, a substrate holder 107, and waveguide ends 103a, 103b. Chamber lid 101 is disposed over an upper opening of chamber body 102. Within a chamber interior 119, substrate holder 107 is provided for holding a substrate 108 that is the member to be processed. A shower plate 105 formed of a dielectric such as ceramic is provided on a surface of chamber lid 101 that faces substrate 108. Shower plate 105 is fixed on a bottom surface of chamber lid 101 by a shower plate holding member 106.

In a region above shower plate 105, openings 120a, 120b are formed in chamber lid 101 such that they penetrate through chamber lid 101. Microwave introduction windows 104a, 104b are respectively provided to openings 120a and 120b. Microwave introduction windows 104a, 104b are formed of dielectrics such as ceramic. Waveguide ends 103a, 103b are provided on an upper surface of chamber lid 101 in regions located above microwave introduction windows 104a, 104b. Waveguide ends 103a, 103b are respectively connected to waveguide 113a, 113b for propagating microwaves to the plasma process apparatus. Temperature-maintaining channels 112a, 112b are respectively formed in waveguide ends 103a, 103b. Temperature-maintaining channels 112a, 112b are provided to allow temperature maintaining material for maintaining an ambient temperature of waveguide ends 103a, 103b at a prescribed temperature to flow therethrough.

A gas introduction hole 121 for supplying into chamber interior 119 a reactive gas to be used for plasma processing is formed in shower plate 105. A recess having a depth of about 0.1 to 1 mm is formed on a bottom surface of chamber lid 101 facing shower plate 105. This recess and a surface of shower plate 105 facing chamber lid 101 together form a reactive gas channel 115. A reactive gas inlet 114 for supplying a reactive gas is formed in chamber lid 101 such that it connects with reactive gas channel 115. Reactive gas inlet 114, reactive gas channel 115 and gas introduction hole 121 are connected, and the reactive gas is supplied from reactive gas inlet 114 via reactive gas channel 115 and gas introduction hole 121 into chamber interior 119.

An O-ring groove 117 is formed in a portion of chamber body 102 connected to chamber lid 101. An O-ring 109 is disposed inside O-ring groove 117. In addition, O-rings 110 are provided inside O-ring grooves 118 which are formed in chamber lid 101 in portions where chamber lid 101 and microwave introduction windows 104a, 104b are connected. Chamber interior 119 can be isolated and sealed from outside air using O-rings 109 and 110.

Now, an operation of the plasma process apparatus shown in FIG. 9 will be briefly described.

First, atmosphere gas is evacuated from chamber interior 119 using a vacuum pumping member (not shown). As a result, chamber interior 119 is held in vacuum state. Then, a reactive gas is supplied from reactive gas inlet 114 via reactive gas channel 115 and gas introduction hole 121 into chamber interior 119. Gas introduction holes 121 are formed such that they are distributed over substantially an entire surface of shower plate 105 so that the reactive gas can be supplied in a substantially uniform manner to a region facing the entire surface of substrate 108. On the other hand, microwaves generated by a microwave generating member (not shown) propagate from waveguides 113a, 113b connected to the microwave generating member to waveguide ends 103a, 103b. Then, microwaves respectively propagate from openings 111a, 111b of waveguide ends 103a, 103b to microwave introduction windows 104a, 104b. The microwaves further propagate from microwave introduction windows 104a, 104b to shower plate 105. Thus, microwaves are radiated substantially uniformly from shower plate 105 to a region facing the entire surface of substrate 108 in chamber interior 119. The reactive gas is excited by the microwaves radiated into chamber interior 119 and plasma is generated. Using the generated plasma, plasma processing such as deposition or ashing can be performed on a surface of substrate 108. In this manner, substantially uniform plasma can be formed in a region facing the entire surface of substrate 108 by uniformly supplying a reactive gas to the entire surface of substrate 108, while at the same time, by uniformly radiating microwaves from shower plate 105.

The plasma process apparatus shown in FIG. 9, however, involves the following problems.

A top surface of shower plate 105 forms a portion of a sidewall surface of reactive gas channel 115 for supplying into chamber interior 119 a reactive gas that is to form the plasma. Shower plate 105 serves as a microwave radiating member for radiating into chamber interior 119 microwaves supplied from microwave introduction windows 104a, 104b. Thus, in some cases, a portion of the microwaves is radiated from shower plate 105 to reactive gas channel 115. In such case where microwaves are radiated into the interior of reactive gas channel 115, discharge in an unwanted location takes place inside reactive gas channel 115, thereby exciting the reactive gas, causing generation of plasma in an unwanted location inside reactive gas channel 115. Such generation of plasma in an unwanted location created the problem of a sidewall surface of reactive gas channel 115 being damaged. Moreover, when using the plasma process apparatus shown in FIG. 9 as a CVD (Chemical Vapor Deposition) apparatus, such problems arise as adhesion of a reaction product that results from plasma generation in an unwanted location to a sidewall surface of reactive gas channel 115. In a case where a sidewall of reactive gas channel 115 is damaged or where a reaction product adheres to the sidewall, a flow rate or a pressure of a reactive gas within reactive gas channel 115 varies from a prescribed value. In addition, since power of the microwaves and the reactive gas that is to attain a plasma state and to contribute to processing such as deposition on substrate 108 are consumed inside reactive gas channel 115 as generation of plasma in an unwanted location takes place, it becomes difficult to supply the reactive gas and the microwave power in prescribed amounts into chamber interior 119 so that, as a result, uniform plasma processing could not be performed with stability.

Moreover, when generation of plasma in an unwanted location takes place in reactive gas channel 115 as described above, a temperature of shower plate 105 in some cases rises locally due to the generation of plasma in the unwanted location. Owing to this localized temperature rise, thermal stress is created in shower plate 105, which, in some cases, leads to deformation of shower plate 105 or damage caused to shower plate 105. When deformation or damage occurs in shower plate 105 in this way, it becomes difficult to keep a process condition to a prescribed state, which makes it difficult to perform plasma processing with stability.

In addition, when reactive gas channel 115 is utilized as a buffer chamber for supplying a reactive gas uniformly to chamber interior 119, it is preferred that a height of reactive gas channel 115, i.e. a volume of reactive gas channel 115, is increased. With the plasma process apparatus shown in FIG. 9, however, when the height of reactive gas channel 115 is thus increased, generation of plasma in an unwanted location would readily occur inside reactive gas channel 115 by microwaves radiated from shower plate 105. Thus, it is difficult to increase the volume of reactive gas channel 115 sufficiently and to improve uniformity of the reactive gas supplied to chamber interior 119 so as further to improve uniformity of the plasma processing.

SUMMARY OF THE INVENTION

An object of the present invention is to provide a plasma process apparatus capable of performing uniform plasma processing with stability by preventing generation of plasma in an unwanted location.

According to one aspect of the present invention, a plasma process apparatus includes a processing chamber, a microwave radiating member, a reactive gas supply member, and a microwave transmission preventing member. The processing chamber has an internal wall surface, and internally performs processing using plasma. The microwave radiating member has one wall surface facing the interior of the processing chamber and the other wall surface located opposite to the one wall surface and facing the internal wall surface of the processing chamber, is disposed such that a space is formed between the other wall surface and a portion of the internal wall surface of the processing chamber, and propagates and radiates microwaves within the processing chamber. The reactive gas supply member supplies into the processing chamber a reactive gas caused to attain a plasma state by the microwaves. The reactive gas supply member includes a reactive gas supply passage having a space formed between the other wall surface of the microwave radiating member and a portion of the internal wall surface of the processing chamber. The microwave transmission preventing member is disposed on a region, which faces the reactive gas supply passage, of the other wall surface of the microwave radiating member.

In this manner, a microwave transmission preventing member that does not allow transmission of microwaves can be disposed between a microwave radiating member and a reactive gas supply passage. Thus, propagation of microwaves from the microwave radiating member to the reactive gas supply passage can be prevented. Therefore, generation of plasma in an unwanted location due to microwaves propagated to the reactive gas supply passage can be prevented in the reactive gas supply passage. Consequently, problems such as damage inflicted on a sidewall of the reactive gas supply passage due to generation of plasma in an unwanted location or deposition of a reaction product inside the reactive gas supply passage due to this generation of plasma in an unwanted location can be prevented. As a result, the reactive gas can be supplied stably into the processing chamber via the reactive gas supply passage so that uniform plasma can be formed. Thus, it becomes possible to perform uniform plasma processing with stability on a surface of a substrate that is the member to be processed.

In addition, since generation of plasma in an unwanted location in the reactive gas supply passage can be prevented, localized temperature rise due to generation of plasma in an unwanted location can be prevented in members (a member forming the reactive gas supply passage, the microwave radiating member and such) disposed in the periphery of the reactive gas supply passage. Thus, deformation or damage caused by the above-described localized temperature rise can be prevented in members disposed in the periphery of the reactive gas supply passage, such as the microwave radiating member. As a result, stable plasma processing can be performed.

Moreover, invasion of microwaves into the reactive gas supply passage from the microwave radiating member can be prevented with certainty so that generation of plasma in an unwanted location within the reactive gas supply passage can be prevented even if a volume of the reactive gas supply passage is increased in order to utilize the reactive gas supply passage as a buffer chamber for making uniform a pressure and the like of the reactive gas supplied into the processing chamber. Thus, the reactive gas supply passage can be sufficiently increased in volume so as to allow it to be used as a buffer chamber without generation of plasma in an unwanted location so that the reactive gas can be supplied into the processing chamber under a condition of greater uniformity. As a result, plasma processing can be performed in a more uniform manner.

In the plasma process apparatus according to the above-described one aspect, a surface of a microwave transmission preventing member is preferably conductive.

In this case, since a conductor does not allow microwaves to pass through, if a surface of the microwave transmission preventing member is conductive, microwaves radiated from the microwave radiating member can be positively prevented from propagating to the reactive gas supply passage.

In the plasma process apparatus according to the above-described one aspect, a microwave transmission preventing member is preferably a conductor plate.

In this case, since a conductor does not allow microwaves to pass through as described above, microwaves radiated from the microwave radiating member can be positively prevented from propagating to the reactive gas supply passage. Moreover, when a metal plate is used as a conductor plate, metal can be worked upon relatively easily so that a microwave transmission preventing member of a prescribed shape can be obtained with ease. Thus, increase in a manufacturing cost of a microwave transmission preventing member can be prevented. As a result, the manufacturing cost of the plasma process apparatus according to the present invention can be prevented from increasing.

In addition, when a metal plate having a high thermal conductivity is used as the conductor plate, and this metal plate and the microwave radiating member are brought into contact, even when a localized temperature rise occurs due to generation of plasma in an unwanted location and the like in the microwave radiating member, this metal plate can allow heat to be rapidly transmitted from a region in which such temperature rise occurs to other regions. As a result, deformation or damage of the microwave radiating member due to the localized temperature rise can be prevented.

In the plasma process apparatus according to the above-described one aspect, a space formed between the other wall surface of the microwave radiating member and a portion of the internal wall surface of the processing chamber is preferably a space surrounded by a recess formed in the internal wall surface of the processing chamber and the microwave transmission preventing member.

In this case, a space can be easily formed between the other wall surface of the microwave radiating member and a portion of the internal wall surface of the processing chamber by forming a recess in the internal wall surface of the processing chamber. Moreover, the microwave transmission preventing member would be located on a wall surface, on the side of the microwave radiating member, of the space included in the reactive gas supply passage so that propagation of microwaves from the microwave radiating member to the reactive gas supply passage can be positively prevented by the microwave transmission preventing member.

In the plasma process apparatus according to the above-described one aspect, the microwave transmission preventing member preferably includes a connection hole which is formed such that it penetrates the microwave transmission preventing member from one surface of the microwave transmission preventing member facing the reactive gas supply passage to the other surface of the microwave transmission preventing member that is located opposite to the one surface and that faces the microwave radiating member, and which is connected to the reactive gas supply passage. The microwave radiating member preferably includes a reactive gas supply hole which is formed such that it penetrates through the microwave radiating member from the other wall surface to the one wall surface of the microwave radiating member and which is connected to the connection hole.

In this case, a reactive gas can be supplied into the processing chamber from the reactive gas supply passage via the connection hole and the reactive gas supply hole. By forming connection holes and reactive gas supply holes such that they are distributed over an entire surface of the microwave radiating member, the reactive gas can be supplied uniformly to a wide extent inside the processing chamber. Consequently, the reactive gas can be supplied in a substantially uniform manner to the entire surface of a substrate and the like that is the member to be processed which is disposed in the processing chamber, whereby uniform plasma processing can be performed.

In addition, a flow rate and such of a reactive gas supplied into the processing chamber can be easily changed by changing at least one of a diameter of the connection hole and a diameter of the reactive gas supply hole. A dielectric such as ceramic is used in general as a microwave radiating member, while a conductor plate such as the above-described metal plate is used as a microwave transmission preventing member. The microwave transmission preventing member was not provided in a conventional plasma process apparatus so that machining was required to change the diameter of the reactive gas supply hole in order to change a flow rate of the reactive gas of each reactive gas supply hole. Generally, since metal is more easily machined than ceramic and the like, the machining to change the diameter of a connection hole formed in a metal plate serving as the microwave transmission preventing member is easier than the machining to change the diameter of a reactive gas supply hole formed in the microwave radiating member made of ceramic and the like. Thus, with the plasma process apparatus according to the present invention, a flow rate and such of the reactive gas can be more easily changed than in the conventional example by changing a diameter of the connection hole. As a result, it becomes possible to prepare a plurality of microwave transmission preventing members, each with a connection hole of a different diameter such that the optimal process conditions can be easily achieved by exchanging the plurality of microwave transmission preventing members according to the kind of reactive gas and the type of processing.

In the plasma process apparatus according to the above-described one aspect, a diameter of the connection hole is preferably smaller than a diameter of the reactive gas supply hole.

In this case, a flow rate of the reactive gas can be greatly changed by changing the diameter of the connection hole. In other words, the diameter of the connection hole can be considered as a controlling factor for changing the flow rate of the reactive gas. Further, if a metal plate is used as the microwave transmission preventing member in which connection holes are formed as described above, metal being easier to machine than ceramic, a diameter of a connection hole can be changed with ease and with high accuracy. As a result, by changing the diameter of the connection hole, a flow rate and such of the reactive gas supplied into the processing chamber from each reactive gas supply hole can be changed with ease and certainty.

In the plasma process apparatus according to the above-described one aspect, the microwave transmission preventing member is preferably formed of the same material as the material that forms the processing chamber.

In this case, the rate of thermal expansion of the microwave transmission preventing member can be made substantially equal to the rate of thermal expansion of a member forming the processing chamber. As a result, when temperatures of the microwave transmission preventing member and a member forming the processing chamber in the vicinity of the microwave transmission preventing member rise according to the plasma processing, the microwave transmission preventing member can be prevented from being subjected to deformation or damage caused owing to the difference in thermal expansion of the microwave transmission preventing member and the material forming the processing chamber accompanying the rise in temperature.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
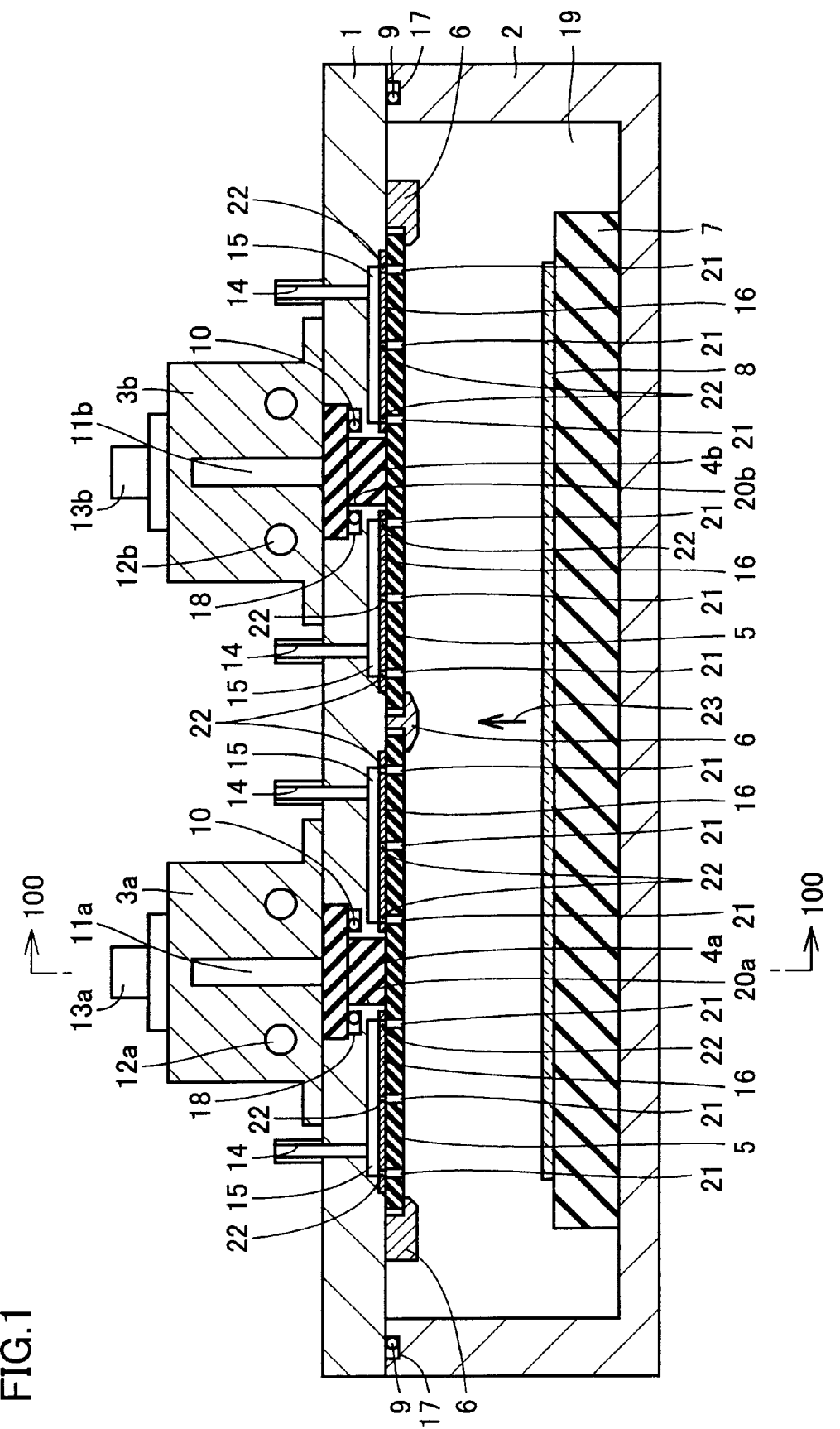
FIG. 1 is a schematic cross sectional view showing a first embodiment of the plasma process apparatus according to the present invention.

The embodiments of the present invention will be described below based on the drawings. In the drawings, the same or corresponding parts are denoted by the same reference characters, and the description thereof will not be repeated.

First Embodiment

The first embodiment of a plasma process apparatus according to the present invention will be described with reference to FIGS. 1 and 2.

Figure 2:
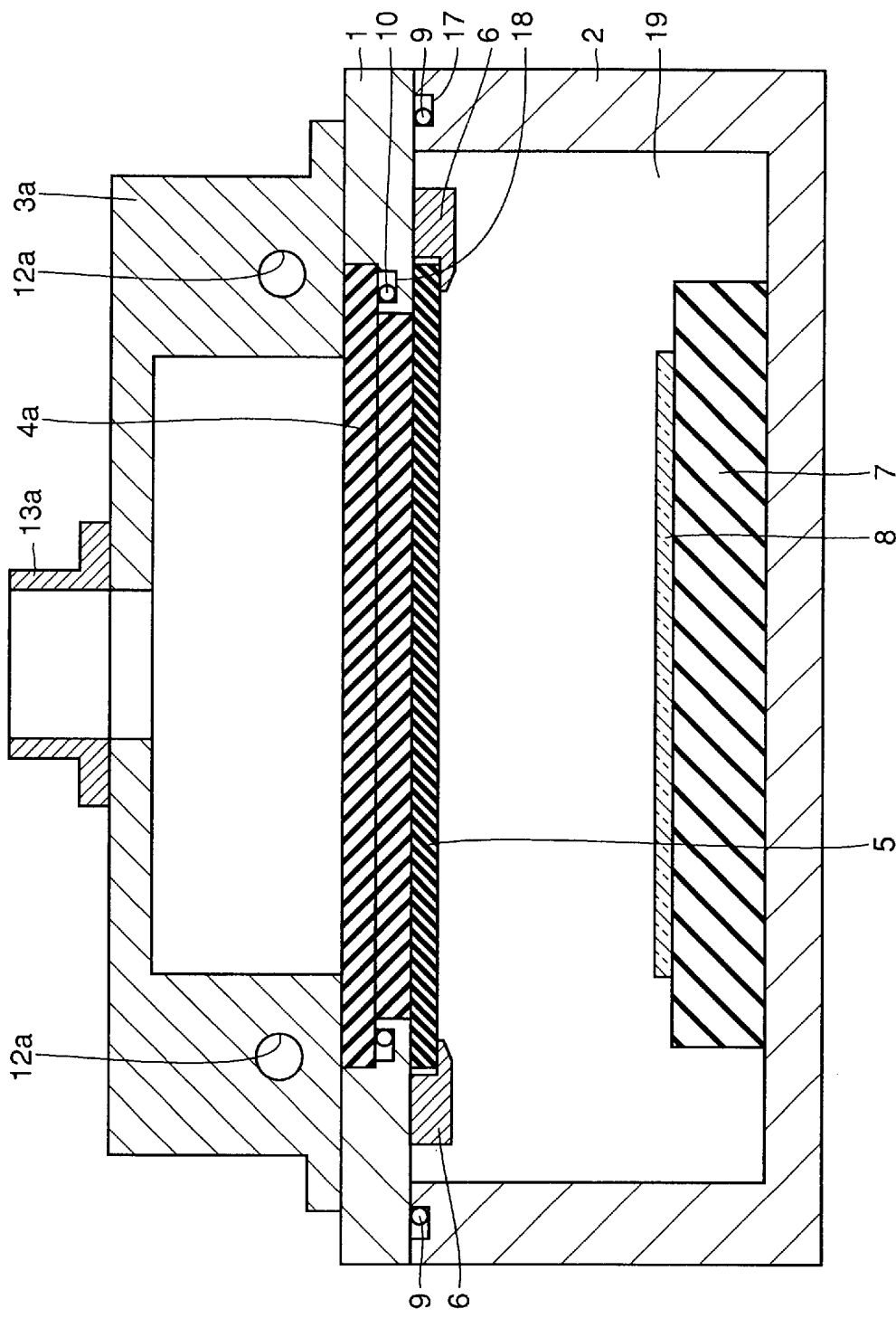
FIG. 2 is a schematic cross sectional view taken along line segment II—II of the plasma process apparatus shown in FIG. 1.

As shown in FIGS. 1 and 2, the plasma process apparatus includes a chamber body 2, a chamber lid 1, a shower plate 5 serving as a microwave radiating member, microwave introduction windows 4a, 4b, waveguide ends 3a, 3b, and a substrate holder 7. Chamber lid 1 as a wall member is disposed over an upper opening of chamber body 2. Chamber lid 1 and chamber body 2 forms a chamber serving as a processing chamber. An O-ring groove 17 is formed in chamber body 2 in a portion where chamber lid 1 and chamber body 2 are connected. An O-ring 9 is disposed inside O-ring groove 17. The portion connecting chamber lid 1 and chamber body 2 is sealed by O-ring 9. Within a chamber interior 19, substrate holder 7 is provided for holding a substrate 8 that is a target of plasma processing. A shower plate 5 as a microwave radiating member is provided on an internal wall surface of chamber lid 1 such that it faces substrate 8 disposed on substrate holder 7. As shown in FIGS. 1 and 2, two shower plates 5 are provided on an internal wall surface of chamber lid 1.

Shower plate 5 has one wall surface facing chamber interior 19 and the other wall surface located opposite to the one wall surface and facing the internal wall surface of the chamber (the internal wall surface of chamber lid 1). Shower plate 5 is fixed to the internal wall surface of chamber lid 1 by being pressed against the internal wall surface of chamber lid 1 with a shower plate holding member 6 serving as a fixing member. Shower plate holding member 6 is made of metal. Shower plate 5 is made of a dielectric, and its main component is preferably aluminum nitride or alumina.

In a region above shower plate 5, openings 20a, 20b are formed in chamber lid 1 such that they penetrate through chamber lid 1. Openings 20a, 20b each have a slit-like shape that extends in a direction perpendicular to the sheet of FIG. 1, as seen from FIGS. 1 and 2. Microwave introduction windows 4a, 4b are respectively provided to openings 20a, 20b. The cross sectional shape of each of microwave introduction windows 4a, 4b is a reverse protruded shape as can be seen in FIG. 1. Microwave introduction windows 4a, 4b are made of dielectrics, and the main component thereof is preferably aluminum nitride or alumina. Microwave introduction windows 4a, 4b are respectively in contact with the other wall surface (top surface) of shower plate 5.

Waveguide ends 3a, 3b are provided on an upper surface of chamber lid 1 in regions located above microwave introduction windows 4a, 4b. Temperature-maintaining channels 12a, 12b are formed in waveguide ends 3a, 3b. Temperature-maintaining channels 12a, 12b are provided to allow the flow of temperature-maintaining material therein for keeping a temperature in the vicinity of waveguide ends 3a, 3b constant. Waveguides 13a, 13b for propagating microwaves generated by a microwave generating member (not shown) to waveguide ends 3a, 3b are respectively connected to waveguide ends 3a, 3b. O-ring grooves 18 are formed in portions connecting microwave introduction windows 4a, 4b and chamber lid 1. An O-ring 10 is provided in an O-ring groove 18. With O-rings 10, portions connecting microwave introduction windows 4a, 4b and chamber lid 1 are sealed. Chamber interior 19 can be isolated from outside air using O-rings 9 and 10.

Figure 3:
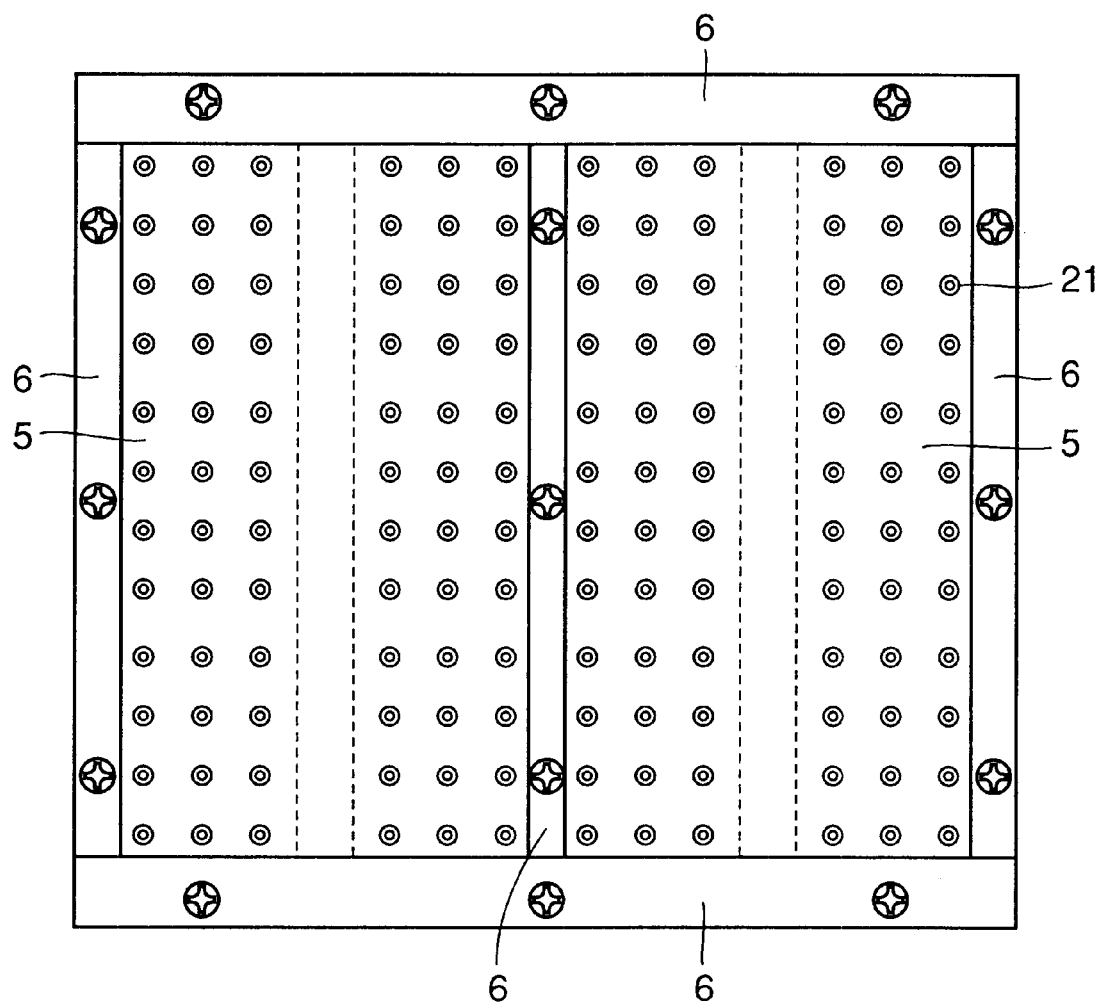
FIG. 3 is a schematic view of an internal wall surface of a chamber lid seen from a direction of an arrow 23 in FIG. 1.

A plurality of gas introduction holes 21 as reactive gas supply holes are formed in shower plate 5. Gas introduction holes 21 are formed such that they penetrate shower plate 5 from one wall surface to the other wall surface of shower plate 5. As shown in FIG. 3, gas introduction holes 21 are disposed such that they are distributed over an entire surface of shower plate 5. As seen from FIG. 3, two shower plates 5 are provided in the plasma process apparatus.

As shown in FIGS. 1 to 3, a metal plate 16 that is a conductor plate serving as a microwave transmission preventing member is disposed between a shower plate 5 and chamber lid 1. A recess as a space is formed in an internal wall surface of chamber lid 1 facing one surface of metal plate 16. This recess and one surface of metal plate 16 together form a reactive gas channel 15 that is a reactive gas supply passage. Metal plate 16 is inserted into a fitting recess formed in the internal wall surface of chamber lid 1 and is fixed therein. Moreover, metal plate 16 may be fixed by being pressed against the internal wall surface of chamber lid 1 by shower plate 5 or fixed to the internal wall surface of chamber lid 1 using a screw and the like.

Figure 4:
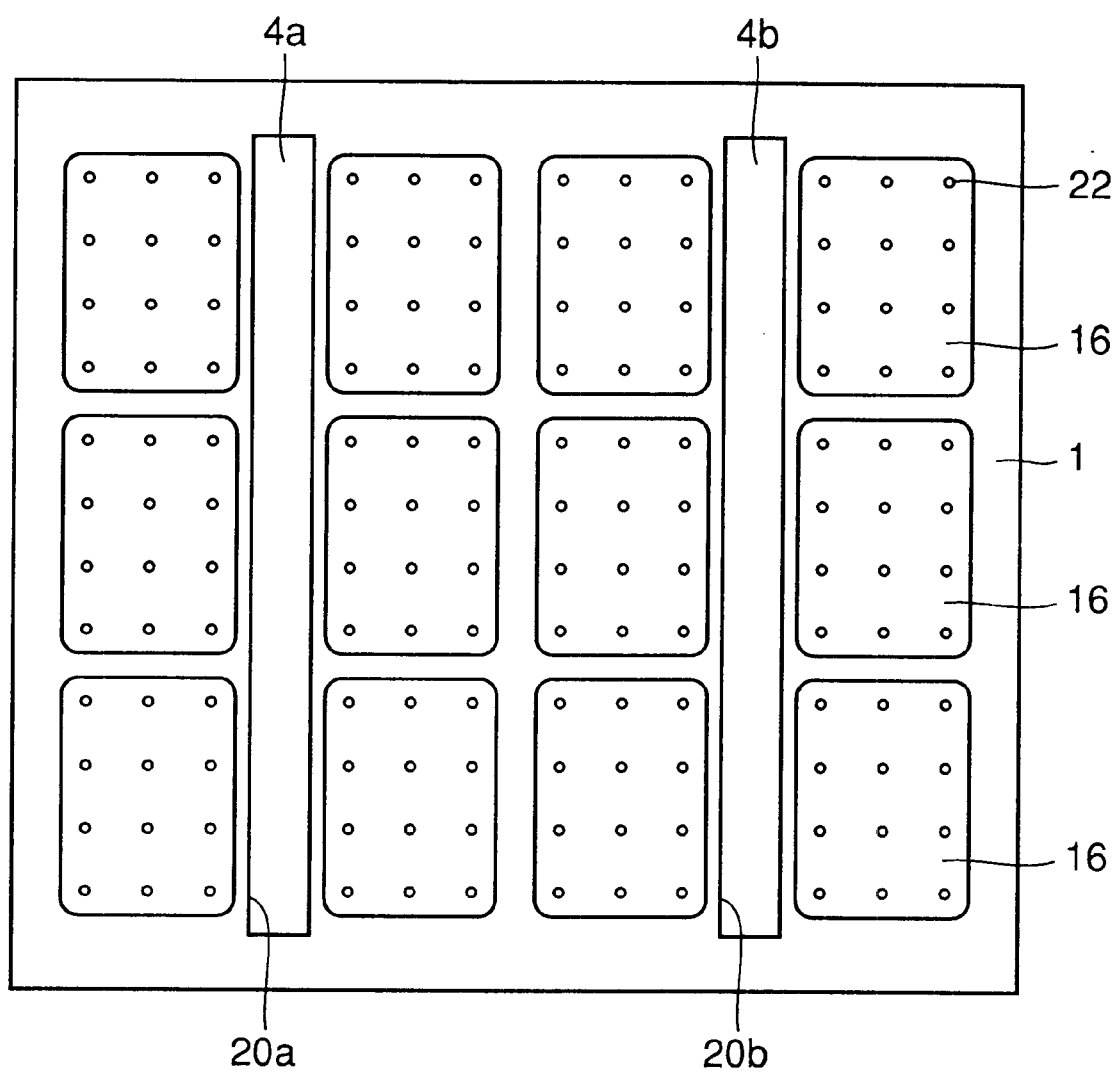
FIG. 4 is a schematic view showing an internal wall surface of the chamber lid with a shower plate and a shower plate holding member removed, seen from a direction of arrow 23 in FIG. 1.
Figure 5:
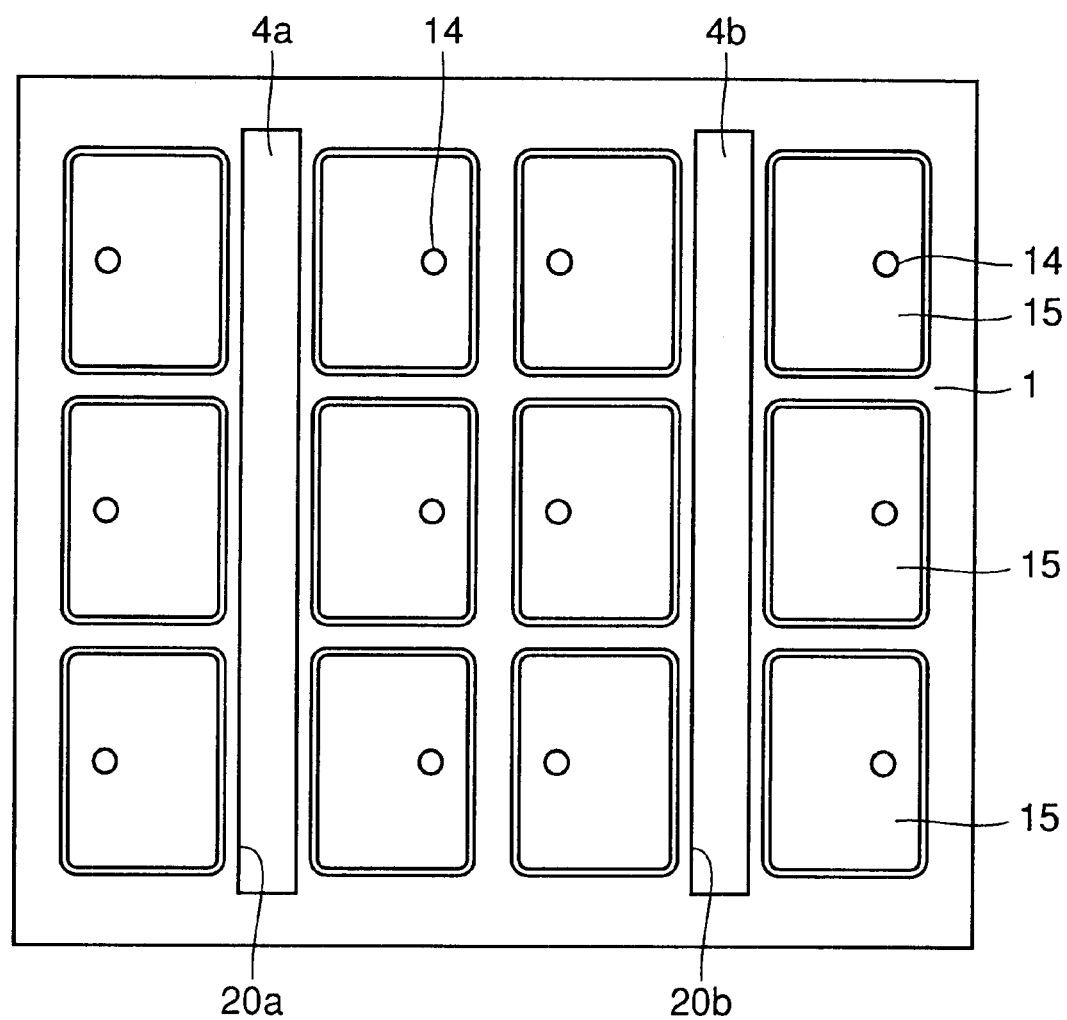
FIG. 5 is a schematic view showing an internal wall surface of the chamber lid with a metal plate further removed from FIG. 4.

As shown in FIGS. 4 and 5, recesses that are to form reactive gas channels 15 are formed in twelve locations in chamber lid 1. Metal plates 16 are provided to cover the respective recesses. A plurality of connection holes 22 are formed in metal plate 16 so as to connect reactive gas channels 15 and gas introduction holes 21. Connection holes 22 are formed such that they penetrate metal plate 16 from one surface of metal plate 16 to the other surface of metal plate 16 that is located opposite to the one surface and that is in contact with shower plate 5.

A reactive gas inlet 14 is formed in chamber lid 1 such that it connects with reactive gas channel 15. A reactive gas supply member is formed by a reactive gas source (not shown) connected to reactive gas inlet 14, reactive gas inlet 14, reactive gas channel 15, connection hole 22, and gas introduction hole 21. A sidewall surface of reactive gas channel 15 includes one surface (top surface) of metal plate 16, and metal plate 16 is located between reactive gas channel 15 and shower plate 5. A thickness of metal plate 16 is preferably set to be larger than a skin depth of microwaves.

Now, an operation in a case where the plasma process apparatus shown in FIGS. 1 and 2 is employed as a plasma CVD apparatus, for instance, will be described.

First, chamber interior 19 is maintained in a vacuum-state using a vacuum pump (not shown). Then, a reactive gas that is to become deposition source material is supplied from reactive gas inlet 14 via gas channel 15, connection hole 22 and gas introduction hole 21 into chamber interior 19. Connection holes 22 and gas introduction holes 21 are formed such that they are distributed to face an entire surface of substrate 8 so that the reactive gas can be supplied uniformly in a location facing the entire surface of a surface to be processed of substrate 8. By regulating a pressure and a flow rate of the reactive gas, chamber interior 19 is maintained at a prescribed pressure. In this state, microwaves supplied from waveguides 13a, 13b propagate via waveguide ends 3a, 3b, waveguide openings 11a, 11b, microwave introduction windows 4a, 4b, and shower plate 5 into chamber interior 19 and are radiated.

The reactive gas introduced into chamber interior 19 is excited by the microwaves, and plasma is generated. Using this plasma, a thin film of a prescribed material can be deposited on a surface of substrate 8 provided on substrate holder 7. Microwave introduction windows 4a, 4b and shower plates 5 are respectively formed of dielectrics so that the microwaves propagate into chamber interior 19 via microwave introduction windows 4a, 4b and shower plates 5.

At this time, metal plate 16 is disposed between reactive gas channel 15 and shower plate 5, as described above. Metal plate 16 is a conductor and does not allow microwave transmission. Thus, the microwaves propagated to shower plate 5 would not be radiated to reactive gas channel 15 because of the presence of metal plate 16. As a result, generation of plasma in an unwanted location inside reactive gas channel 15 due to microwaves can be prevented. Consequently, an internal wall of reactive gas channel 15 can be prevented from being damaged by generation of plasma in the unwanted location. Moreover, the problem of generation of deposition inside reactive gas channel 15 due to generation of plasma in an unwanted location can also be prevented. As a result, a flow rate of a reactive gas supplied from reactive gas channel 15 via connection hole 22 and gas introduction hole 21 into chamber interior 19 can be prevented from departing from a prescribed flow rate so that uniform plasma can be generated with stability. As a result, uniform plasma processing can be achieved.

In addition, since metal plate 16 having a relatively high thermal conductivity is disposed on the other wall surface (top surface) of shower plate 5, uniformity of an in-plane temperature of shower plate 5 can be achieved. Consequently, when a temperature rise occurs locally due to plasma in shower plate 5, heat can be rapidly transmitted from a region in which such temperature rise occurred to other regions. As a result, deformation or damage of shower plate 5 due to the localized temperature rise can be prevented.

Moreover, invasion of microwaves into reactive gas channel 15 from shower plate 5 can be prevented with certainty so that generation of plasma in an unwanted location inside reactive gas channel 15 can be prevented even if a volume of reactive gas channel 15 is increased in order to utilize reactive gas channel 15 as a buffer chamber for making uniform a pressure and the like of the reactive gas supplied into chamber interior 19. As a result, reactive gas channel 15 can be sufficiently increased in volume so as to allow it to be used as a buffer chamber without generation of plasma in an unwanted location so that the reactive gas can be supplied into chamber interior 19 under a condition of greater uniformity.

Moreover, metal can be worked upon relatively easily so that metal plate 16 as a microwave transmission preventing member having a prescribed shape can be relatively easily obtained. Thus, increase in the manufacturing cost of the plasma process apparatus according to the present invention can be prevented.

In addition, a space can be easily formed between the other wall surface of shower plate 5 and a portion of the internal wall surface of chamber lid 1 by forming a recess in the internal wall surface of chamber lid 1 as described above. Further, metal plate 16 would be located on a wall surface, on the side of shower plate 5, of the space included in reactive gas channel 15 so that propagation of microwaves from shower plate 5 to reactive gas channel 15 can be positively prevented by metal plate 16.

Moreover, a flow rate and such of a reactive gas supplied into chamber interior 19 can be easily changed by changing a diameter of connection hole 22 of metal plate 16 that can be relatively easily machined.

In addition, shower plate 5 is formed of a dielectric. Microwaves can be propagated into chamber interior 19 with certainty by forming shower plate 5 using such dielectric that allows microwave transmission.

Further, as shown in FIGS. 1 and 5, reactive gas inlet 14 formed such that it connects with reactive gas channel 15 is formed in a location shifted off a central portion of reactive gas channel 15. Since reactive gas channel 15 serves the function of a buffer chamber, however, it is possible to control with sufficient accuracy a flow rate and such of a reactive gas introduced from gas introduction holes 21 into chamber interior 19.

A modification to the first embodiment of the plasma process apparatus according to the present invention will be described with reference to FIG. 6.

Figure 6:
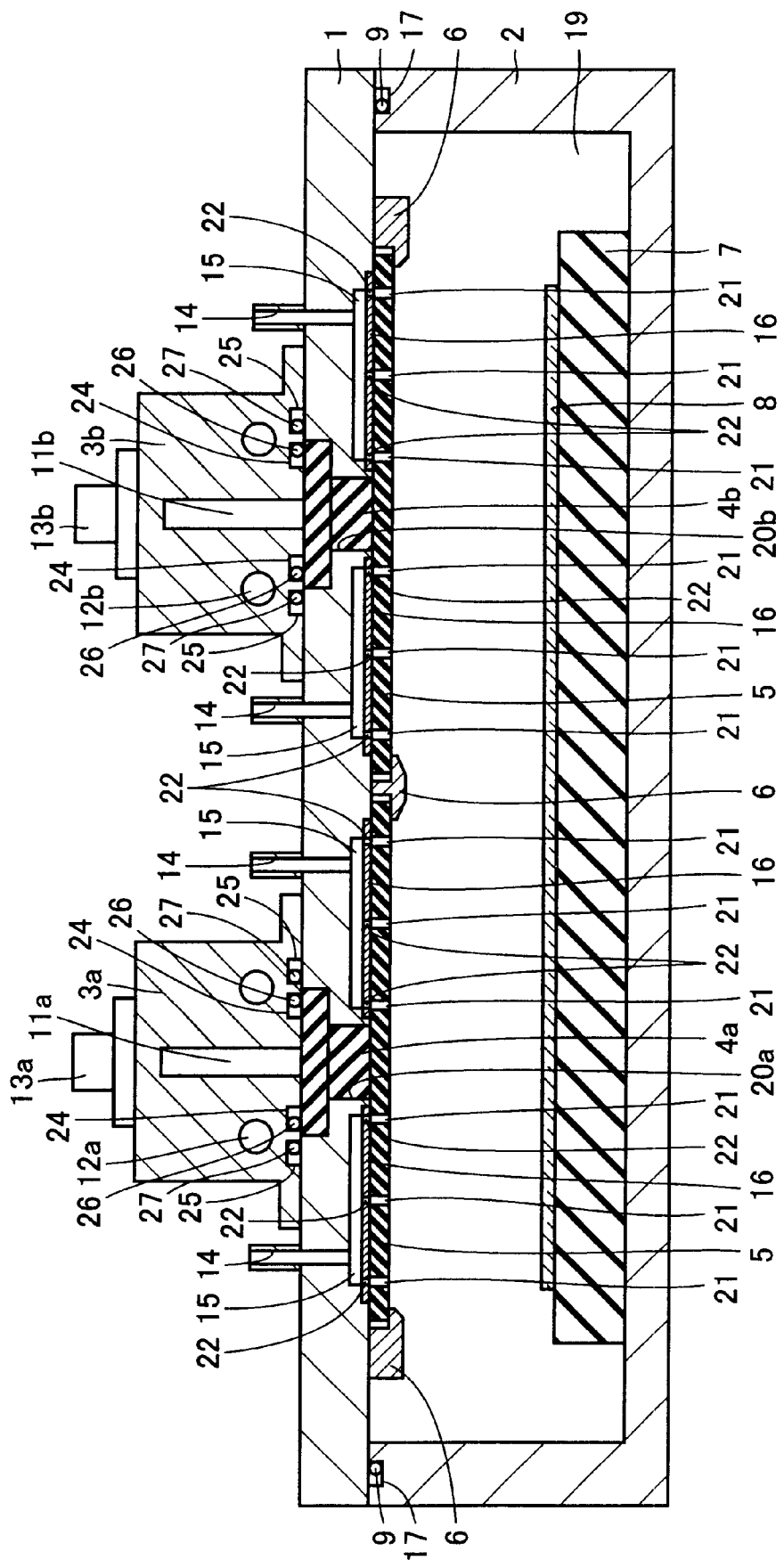
FIG. 6 is a schematic cross sectional view showing a modification to the first embodiment of the plasma process apparatus according to the present invention.

As shown in FIG. 6, the plasma process apparatus has basically the same structure as that of the plasma process apparatus shown in FIGS. 1 to 5. The plasma process apparatus shown in FIG. 6, however, differs from the plasma process apparatus shown in FIGS. 1 to 5 in that set up positions of O-rings 26, 27 for achieving sealing in portions joining microwave introduction windows 4a, 4b and chamber lid 1 are different. Thus, in the plasma process apparatus shown in FIG. 6, O-ring grooves 24, 25 are formed on a lower surface of waveguide ends 3a, 3b located on microwave introduction windows 4a, 4b. O-rings 26, 27 are respectively provided in O-ring grooves 24, 25. Microwaves supplied from waveguides 13a, 13b are propagated to shower plate 5 from openings 11a, 11b of waveguide ends 3a, 3b via microwave introduction windows 4a, 4b, respectively.

The plasma process apparatus shown in FIG. 6 can achieve the same effects as those obtained by the plasma process apparatus according to the first embodiment of the present invention shown in FIGS. 1 to 5. At the same time, since O-rings 26, 27 are provided in locations as shown in FIG. 6, it becomes possible to dispose O-rings 26, 27 in locations farther away from a propagation path of microwaves that propagates from microwave introduction windows 4a, 4b to shower plates 5. Thus, the risk of O-rings 26, 27 being damaged by the microwaves can be reduced. Consequently, longer lives of O-rings 26, 27 can be achieved. As a result, stable operation of the plasma process apparatus can be achieved over a long period.

In addition, O-rings 26, 27 having structures as shown in FIG. 6 achieve the same effects when applied to second to fourth embodiments of the present invention described below. Moreover, in a case where metal plate 16 may possibly react in some way with the reactive gas supplied, it is required that a metal plate surface be subjected to surface treatment such as anodic oxidation treatment.

Second Embodiment

Turning to FIGS. 1 and 3, in the second embodiment of the plasma process apparatus according to the present invention, a diameter of gas introduction hole 21 of shower plate 5 made of a dielectric such as alumina or aluminum nitride is formed to be 1.0 mm, for example. Then, a diameter of connection hole 22 of metal plate 16 is changed in order to change a flow rate and such of a reactive gas supplied into chamber interior 19. Specifically, a plurality of metal plates 16 having different diameters are prepared. Machining of such metal plate 16 is easier than machining of shower plate 5 so that the plasma process apparatus according to the present invention can be easily obtained.

In addition, as shown in FIGS. 3 and 4, a diameter of connection hole 22 is set to be smaller than a diameter of gas introduction hole 21. In such a case, the diameter of connection hole 22 can be a controlling factor for changing a flow rate of the reactive gas. Further, machining of metal plate 16 in which connection hole 22 is formed is relatively easy so that machining of high accuracy is possible. Thus, a flow rate of the reactive gas supplied via connection hole 22 and gas introduction hole 21 into chamber interior 19 can be positively and easily changed by changing a diameter of connection hole 22. Moreover, in a case where metal plate 16 may possibly react in some way with the reactive gas supplied, it is required that a metal plate surface be subjected to surface treatment such as anodic oxidation treatment.

Third Embodiment

The third embodiment of the plasma process apparatus according to the present invention has the same structure as the plasma process apparatus according to the first embodiment of the present invention shown in FIGS. 1 to 6, and further, metal plate 16 and chamber lid 1 are formed of the same material. In this manner, a rate of thermal expansion of metal plate 16 can be made substantially equal to a rate of thermal expansion of chamber lid 1. Consequently, when temperatures of metal plate 16 and chamber lid 1 rise according to the plasma processing, deformation or damage owing to the difference in thermal expansion of metal plate 16 and chamber lid 1 can be prevented from being caused to metal plate 16. In a case in which metal plate 16 formed of the same material as chamber lid 1 may possibly react in some way with the reactive gas supplied, it is required that a metal plate surface be subjected to surface treatment such as anodic oxidation treatment.

Fourth Embodiment

Figure 7:
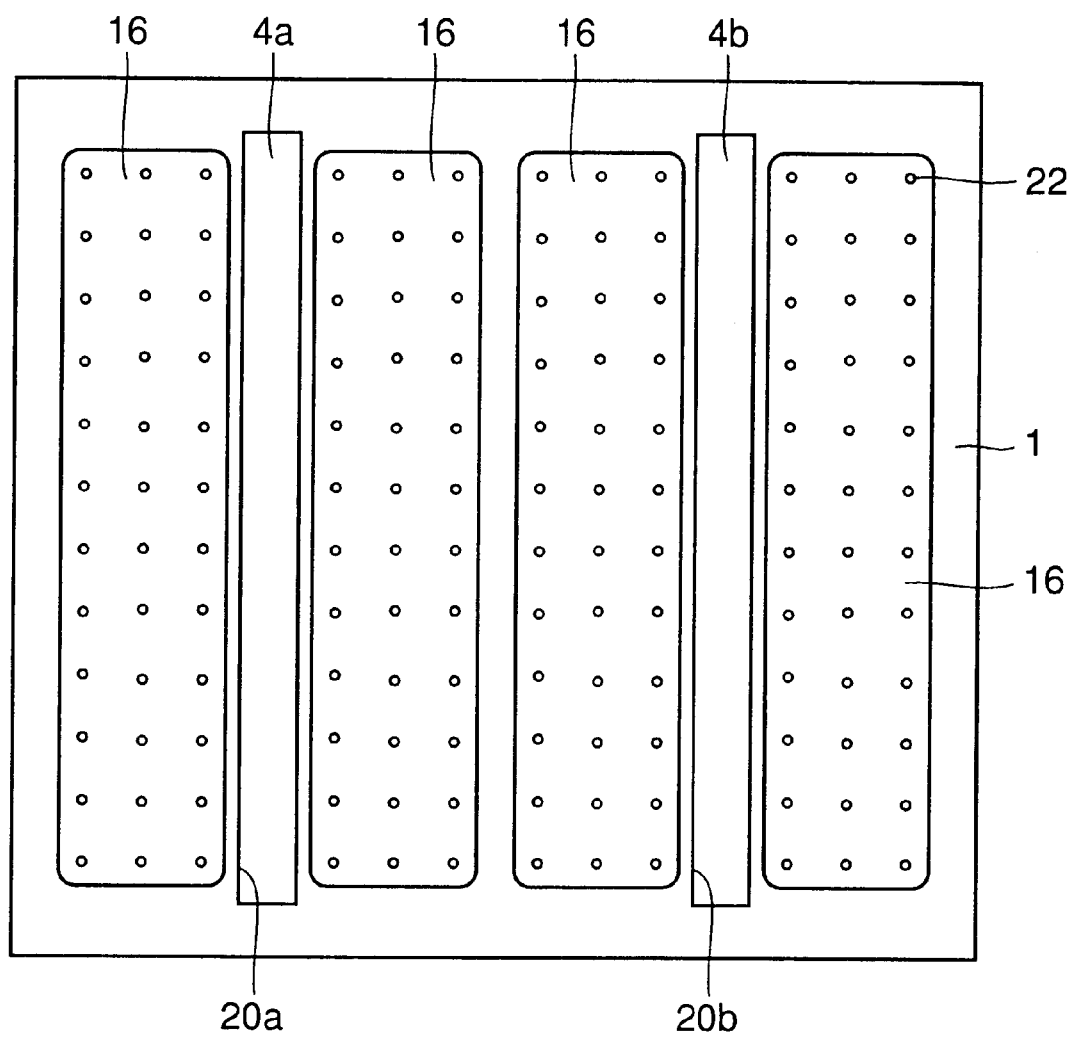
FIG. 7 is a schematic view showing an internal wall surface of a chamber lid in a fourth embodiment of the plasma process apparatus according to the present invention.
Figure 8:
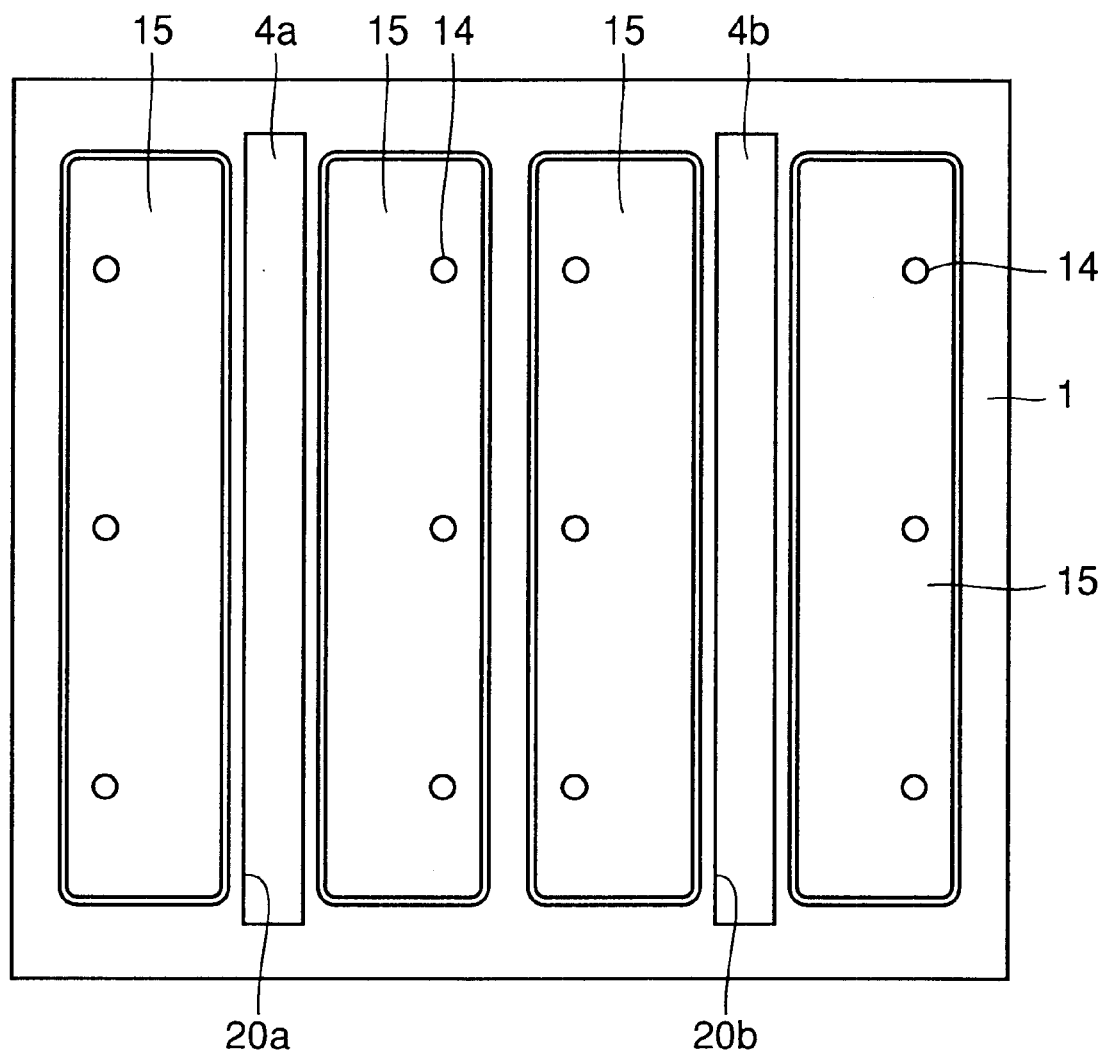
FIG. 8 is a schematic view showing an internal wall surface of the chamber lid with a metal plate further removed from FIG. 7.
Figure 9:
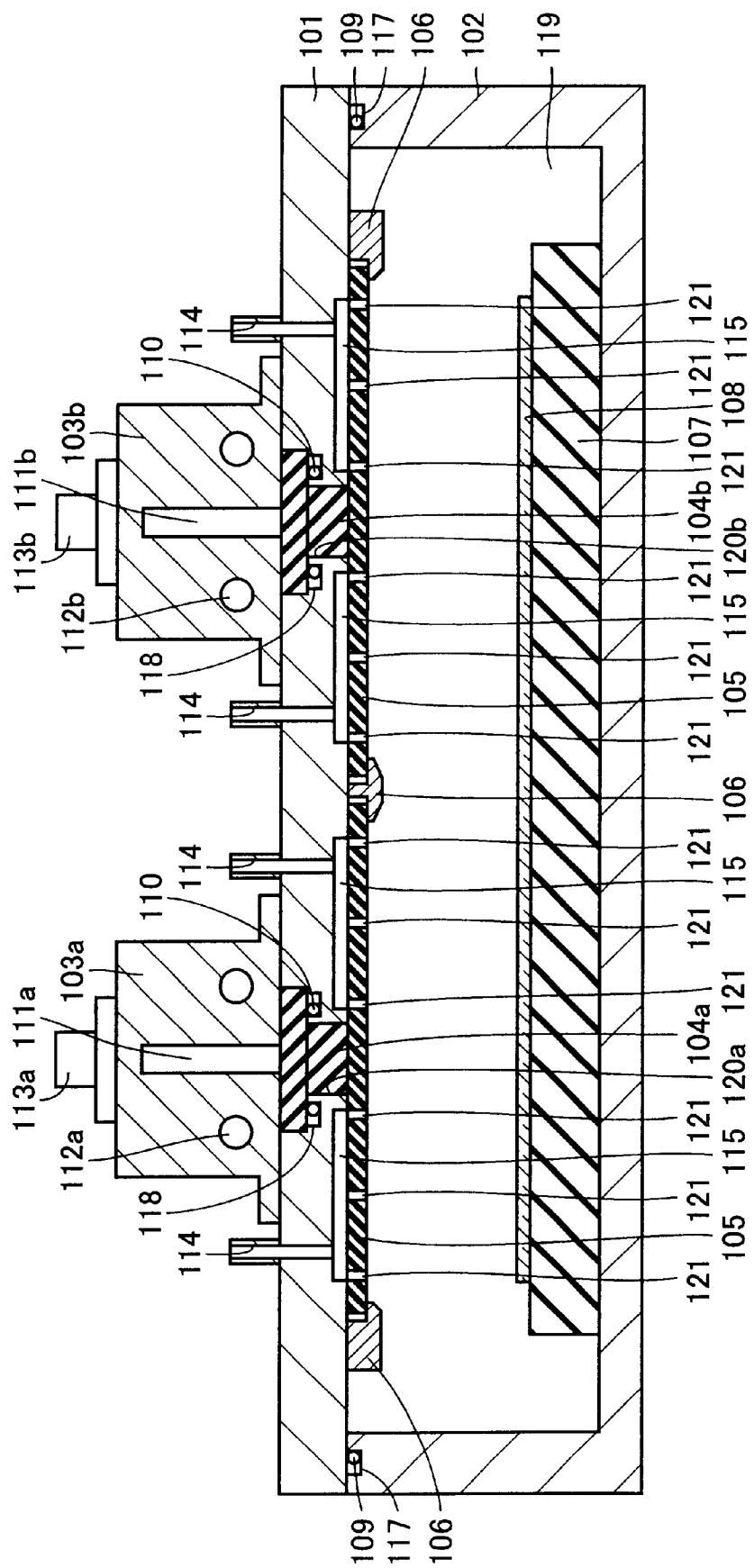
FIG. 9 is a schematic cross sectional view representing a plasma process apparatus that forms the basis for the present invention.

The fourth embodiment of the plasma process apparatus according to the present invention has basically the same structure as the plasma process apparatus according to the first embodiment of the present invention shown in FIGS. 1 to 6; however, shapes of reactive gas channel 15 and metal plate 16 differ from those in the first embodiment, as shown in FIGS. 7 and 8. The fourth embodiment of the plasma process apparatus according to the present invention will be described with reference to FIGS. 7 and 8. FIG. 7 corresponds to FIG. 4, while FIG. 8 corresponds to FIG. 5.

As shown in FIGS. 7 and 8, the plasma process apparatus has an arrangement in which three reactive gas channels 15 of FIG. 5 are integrated. In other words, recesses that are to become four reactive gas channels 15 (see FIG. 8) in total are formed on an internal wall surface of chamber lid 1, with openings 20a, 20b respectively intervening therebetween. Four metal plates 16 are disposed such that they cover these recesses, as shown in FIG. 7.

In this case, the same effects as those obtained by the plasma process apparatus according to the first embodiment of the present invention can be achieved, while at the same time, the number of metal plates 16 can be reduced from that in the plasma process apparatus according to the first embodiment so that maintenance of the plasma process apparatus can be done more easily.

Moreover, each of the plasma process apparatuses shown in first to fourth embodiments of the present invention can be used not only as a CVD apparatus but also as an etching apparatus, an ashing apparatus, or the like, for instance, to achieve the above-described effects.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A plasma process apparatus, comprising:

a processing chamber having an internal wall surface for internally performing processing using plasma;

a shower plate serving as-a microwave radiating member having one wall surface facing an interior of said processing chamber and other wall surface that is located opposite to the one wall surface and that faces the internal wall surface of said processing chamber, being disposed such that at least a space is formed between the other wall surface and a portion of the internal wall surface of said processing chamber; and reactive gas supply means for supplying into said processing chamber a reactive gas caused to attain a plasma state by said microwaves, wherein said reactive gas supply means includes a reactive gas supply passage having the space formed between the other wall surface of said microwave radiating member and a portion of the internal wall surface of said processing chamber, said plasma process apparatus further comprising:

a microwave transmission preventing member disposed on a region between said reactive gas supply passage and the other wall surface of said microwave radiating member, said microwave radiating member propagating and radiating microwaves within said processing chamber other than within said gas supply passage.

2. The plasma process apparatus according to claim 1, wherein
a surface of said microwave transmission preventing member is conductive.

3. The plasma process apparatus according to claim 2, wherein
said microwave transmission preventing member is a conductor plate.

4. The plasma process apparatus according to claim 1, wherein
a space formed between the other wall surface of said microwave radiating member and a portion of the internal wall surface of said processing chamber is a space surrounded by a recess formed in the internal wall surface of said processing chamber and said microwave transmission preventing member.

5. The plasma process apparatus according to claim 1, wherein
said microwave transmission preventing member includes a connection hole which is formed such that it penetrates said microwave transmission preventing member from one surface of said microwave transmission preventing member facing said reactive gas supply passage to other surface of said microwave transmission preventing member that is located opposite to said one surface and that faces said microwave radiating member, and which is connected to said reactive gas supply passage, and
said microwave radiating member includes a reactive gas supply hole which is formed such that it penetrates through said microwave radiating member from the other wall surface to the one wall surface of said microwave radiating member and which is connected to said connection hole.

6. The plasma process apparatus according to claim 5, wherein
a diameter of said connection hole is smaller than a diameter of said reactive gas supply hole.

7. The plasma process apparatus according to claim 1, wherein
said microwave transmission preventing member is formed of a same material as a material that forms said processing chamber.

\* \* \* \* \*